US006291347B1

(12) United States Patent
Russell et al.

(10) Patent No.: US 6,291,347 B1
(45) Date of Patent: Sep. 18, 2001

(54) METHOD AND SYSTEM FOR CONSTRUCTING SEMICONDUCTOR DEVICES

(75) Inventors: Noel M. Russell, Dallas; Anthony J. Konecni, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/671,328

(22) Filed: Sep. 26, 2000

Related U.S. Application Data

(62) Division of application No. 09/415,508, filed on Oct. 8, 1999.

(51) Int. Cl.[7] .................................................. H01L 21/44
(52) U.S. Cl. ........................ 438/687; 438/679; 438/686
(58) Field of Search .................................... 438/582, 687, 438/679, 680; 427/250, 252; 118/729

(56) References Cited

U.S. PATENT DOCUMENTS

| Re. 35,614 | * | 9/1997 | Norman et al. | 427/250 |
|---|---|---|---|---|
| 5,085,731 | | 2/1992 | Norman et al. | 156/646 |
| 5,374,594 | | 12/1994 | van de Ven et al. | 437/247 |
| 5,516,367 | | 5/1996 | Lei et al. | 118/725 |
| 5,728,629 | | 3/1998 | Mizuno et al. | 438/680 |
| 5,851,299 | | 12/1998 | Cheng et al. | 118/729 |
| 5,888,304 | * | 3/1999 | Umotoy et al. | 118/720 |
| 6,090,960 | * | 7/2000 | Senzaki et al. | 556/9 |
| 6,096,135 | * | 8/2000 | Guo et al. | 118/729 |
| 6,110,530 | * | 8/2000 | Chen et al. | 427/253 |

OTHER PUBLICATIONS

Norman, et al.; "Chemical additives for improved copper chemical vapour deposition processing;" Elsevier Science S.A.; pp. 46–51, 1995.

Naik, et al.; "CVD of copper using copper(I) and copper (II)∃–diketonates;" Elsevier Science S.A.; pp. 60–66, 1995.

* cited by examiner

Primary Examiner—Amir Zarabian
Assistant Examiner—Bradley Smith
(74) Attorney, Agent, or Firm—April M. Mosby; W. James Brady; Frederick J. Telecky, Jr.

(57) ABSTRACT

A system for constructing semiconductor devices is disclosed. The system comprises a wafer (102) having semiconductor devices (104), a bevel (108), an edge (110), a frontside (111), and a backside (112). The system also has a chamber (107), and a heater (106) coupled to the interior of the chamber (107) and operable to hold and heat the wafer (102). A showerhead (114) is also coupled to the interior of the chamber (107) and is operable to introduce a precursor gas (116) containing copper over the wafer (102). A shield (118) is coupled to the interior of the chamber (107) and is operable to partially shield the bevel (108), the edge (110), and the backside (112) of the wafer (102) from the precursor gas (116). There is an opening (122) in the chamber (107) through which a reactive backside gas (124) may be introduced under the wafer (102). A method for constructing semiconductor devices is disclosed. Step one calls for placing a wafer (102) on a heater (106) in a chamber (107). Step two requires heating the wafer with a heater (106). Step three provides for partially shielding the wafer (102) with a shield (118). In step four, the method provides for introducing a precursor gas (116) containing copper into the chamber (107) above the wafer (102). The last step calls for introducing a reactive backside gas (124) into the chamber (107) below the wafer (102) through an opening (122).

8 Claims, 1 Drawing Sheet

METHOD AND SYSTEM FOR CONSTRUCTING SEMICONDUCTOR DEVICES

This application is a Division of Ser. No. 09/415,508 filed Oct. 8, 1999.

TECHNICAL FIELD OF THE INVENTION

This invention relates generally to the field of circuit fabrication and more specifically to a method and system for constructing semiconductor devices.

BACKGROUND OF THE INVENTION

The construction of semiconductor devices involves using controlled vapors to apply very thin metal coatings to silicon wafers. Chemical vapor deposition (CVD) is a process for applying these coatings. In this process, a volatile metal-organic precursor gas comes in contact with areas of a wafer where a metal film is needed. A chemical reaction occurs, resulting in the deposition of metal on the surface. The coatings, however, must be applied only to specific parts of the wafer. If the coating is deposited on the bevel or edge of the wafer, it may cause the coating on the frontside of the wafer to peel away. If the coating attaches to the backside of the wafer, it may contaminate other pieces of equipment as the wafer undergoes further processing. Finally, the precursor gas may reach areas of the equipment under the backside of the wafer, causing contamination of the process equipment.

Known methods for preventing a precursor gas from reaching the back parts of a wafer, or from contaminating the equipment include contact-based methods and purge-based methods. The contact-based methods use a ring to shield the bevel, edge, and backside of the wafer. The ring comes in contact with the front surface of the wafer in order to prevent the reactive gas from reaching the lower parts of the wafer. The contact methods, however, are problematic because contact with the wafer may cause particle generation. Moreover, the ring covers part of the wafer, reducing the area on which a coating may be deposited. In addition, since the ring is cooler than the wafer, it cools part of the wafer surface, causing a drop in the deposition rate, which leads to irregularities in the coating. In the purge-based methods, a ring partially shields the lower parts of the wafer without touching the wafer, leaving a gap between the ring and the wafer. An air flow of an inert gas is directed from under the shield through the gap to prevent the precursor gas from reaching the lower parts of the wafer. A problem with the purge methods is that the gas flow needed to prevent the precursor gas from entering the gap causes deformities in the metal coating.

While these devices and methods have provided improvements over prior approaches, the challenges in the field of circuit fabrication has continued to increase with demands for more and better techniques having greater effectiveness. Therefore, a need has arisen for a new method and system for constructing semiconductor devices.

SUMMARY OF THE INVENTION

In accordance with the present invention, a method and system for constructing semiconductors are provided that substantially eliminate or reduce disadvantages and problems associated with previously developed systems and methods.

According to one embodiment of the present invention, a system for constructing semiconductor devices is disclosed. The system comprises a wafer having semiconductor devices, a bevel, an edge, a frontside, and a backside. The system also comprises a chamber. A heater is coupled to the interior of the chamber and is operable to hold and heat the wafer. A showerhead is also coupled to the interior of the chamber and is operable to introduce a precursor gas containing copper over the frontside of the wafer. A shield is coupled to the interior of the chamber and is operable to partially shield the bevel, the edge, and the backside of the wafer from the precursor gas. The chamber has on opening through which a reactive backside gas may be introduced below the backside of the wafer.

According to one embodiment of the present invention, a method for constructing semiconductor devices is also disclosed. Step one calls for placing a wafer on a heater in a chamber. Step two requires heating the wafer with the heater. Step three provides for partially shielding the wafer with a shield. In step four, the method provides for introducing a precursor gas containing copper into the chamber above the frontside of the wafer. The last step calls for introducing a reactive backside gas into the chamber below the backside of the wafer.

A technical advantage of the present invention is that the shield does not come into contact with the wafer, thus avoiding the particle generation and coating irregularities associated with the contact-based methods, while allowing for more coating coverage than in the contact-based methods. Another technical advantage of the present invention is that the gas flow of the backside gas is sufficiently low to prevent the deformation of the coating that occurs with inert gas purge-based methods.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Figure 1:
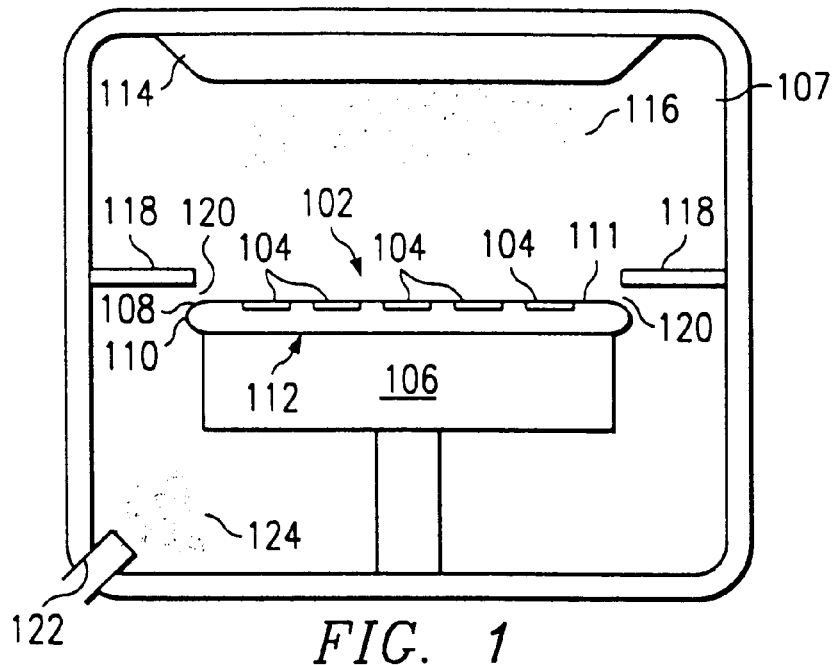
FIG. 1 is a system block diagram of one embodiment of a system in accordance with the present invention.

FIG. 1 is a system block diagram of one embodiment of a system in accordance with the present invention. In this embodiment, a wafer 102 having one or more semiconductor devices 104 is placed on a heater 106, which is coupled to the inside of a chamber 107. The wafer 102 may be, for example, a silicon wafer on which semiconductor devices 104 are being fabricated. The wafer 102 has a bevel 108, an edge 110, a frontside 111, and a backside 112. A showerhead 114 is coupled to the inside of the chamber 107. The showerhead introduces a precursor gas 116 into the area above the wafer 102 to form a coating on the frontside 111. The precursor gas 116 contains copper, and may also contain, for example, a mixture comprising approximately 2.5% trimethylvinylsilane (tmvs) and approximately 0.5% hexafluoroacetylacetic acid (hfac). Other suitable mixtures may be used, for example, a mixture comprising trimethylvinylsilyl hexafluoroacetylacetonato Copper I ((tmvs)hfacCu$^I$) and approximately up to 50% tmvs, or, for example, (tmvs)hfacCu$^I$ and approximately up to 10% hfac, approximately up to 20% tmvs, and approximately up to 50% Cu(hfac)$_2$. A shield 118 is coupled to the inside of the chamber 107. The shield partially protects the bevel 108, the edge 110, and the backside 112 of the wafer 102 from the precursor gas 116. The shield 118 does not come into contact with the wafer 102, so there is a gap 120 between the shield 118 and wafer 102. The chamber 107 has an opening 122 through which a reactive backside gas 124 may be introduced under the shield 118. The backside gas 124 may comprise, for example, tmvs. The backside gas 124 may comprise, for example, approximately 50% tmvs, balance argon, or other inert gas, or may comprise, for example, a mixture of approximately 50% tmvs and approximately 20% to 40% hfac, balance argon, or other inert gas. Other suitable mixtures may be used, for example, a mixture comprising tmvs and $Cu(hfac)_2$.

Figure 2:
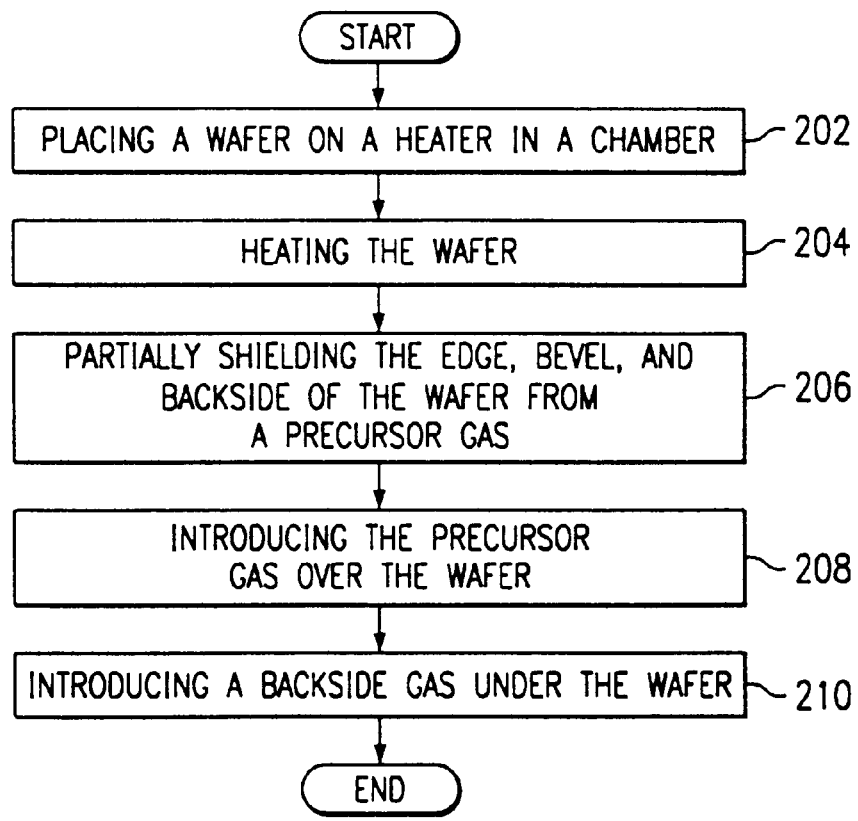
FIG. 2 is a flowchart demonstrating one embodiment of a method for constructing semiconductor devices in accordance with the present invention.

FIG. 2 is a flowchart demonstrating one embodiment of a method of constructing semiconductors in accordance with the present invention. The method begins with step 202, where a wafer 102 is placed on a heater 106 in a chamber 107. In step 204, the heater 106 heats the wafer 102. In step 206, a shield 118 partially shields the bevel 108, the edge 110, and the backside 112 of the wafer 102 from a precursor gas 116. There is a gap 120 between the shield 118 and the wafer 102.

The method then proceeds to step 208, where a showerhead 114 introduces the precursor gas 116 in the area above the frontside 111 of the wafer 102. The precursor gas 116 contains copper, and may contain, for example, a mixture of approximately 2.5% tmvs and approximately 0.5% hfac. In step 210, a backside gas 124 is introduced into the area under the wafer 102 through an opening 122 of the chamber 107. The backside gas 124 reacts with the decomposition products of the copper precursor to suppress the deposition reaction. The backside gas 124 may suppress the decomposition reaction by reacting with the decomposition products of the copper precursor to reduce the rate of decomposition of the copper precursor. A backside gas may contain, for example, approximately 50% tmvs, or a mixture of approximately 50% tmvs and approximately 20–40% hfac. The tmvs suppresses the deposition of copper on the bevel 108, edge 110, and backside 112 of the wafer 102, and also on the heater 106 and the parts of the chamber 107 below the shield 118. The suppression of the deposition of copper may be described using the following equations:

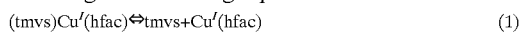

$$(tmvs)Cu'(hfac) \Leftrightarrow tmvs + Cu'(hfac) \quad (1)$$

$$2Cu'(hfac) \Leftrightarrow Cu^0 + Cu''(hfac)_2 \quad (2)$$

Equation (1) describes how a precursor gas 116 comprising copper, tmvs, and hfac forms tmvs and a copper-hfac intermediate. Equation (2) describes how the compound breaks down into copper, which is deposited on the wafer, and a copper compound. The backside gas 124 contains tmvs, which forces the reaction described by Equation (1) to the left, suppressing the formation of copper and preventing copper deposition on the back parts of the wafer 102. The pressure of the backside gas 124 is greater than that of the precursor gas 116 to decrease the likelihood that the precursor gas 116 passes through the gap 120 to reach the back parts of the wafer 102. The pressure of the backside gas 124, however, is not sufficient to create deformities in the deposited film on the wafer 102 surface. Since the tmvs suppresses deposition chemically in addition to physically, the pressure required is lower than the pressure needed for suppression using an inert backside gas.

A technical advantage of the present invention is that the shield does not come into contact with the wafer, thus avoiding the particle generation and coating irregularities associated with the contact-based methods, while allowing for more coating coverage than in the contact-based methods. Another technical advantage of the present invention is that the gas flow of the backside gas is sufficiently low to prevent the deformation of the coating that occurs with inert gas purge-based methods.

Although an embodiment of the invention and its advantages are described in detail, a person skilled in the art could make various alternations, additions, and omissions without departing from the spirit and scope of the present invention as defined by the appended claims.

What is claimed is:

1. A method for constructing semiconductor devices, the method comprising:

a. placing a wafer having semiconductor devices thereon on a heater in a chamber;

b. heating the wafer with the heater;

c. partially shielding the wafer with a shield;

d. introducing a precursor gas containing copper into the chamber above the wafer, the precursor gas operable to initiate copper deposition on the wafer; and e. introducing into the chamber below the wafer a backside gas operable to chemically react with the precursor gas to suppress deposition, wherein the pressure of backside gas is greater than the pressure of the precursor gas and the backside gas comprises trimethylvinylsilane.

2. The method of claim 1 wherein the precursor gas further comprises hexafluoroacetylacetic acid.

3. The method of claim 1 wherein the precursor gas further comprises trimethylvinylsilane.

4. The method of claim 1 wherein the precursor gas further comprises trimethylvinylsilyl hexafluoroacetylacetonato Copper I.

5. The method of claim 1 wherein the backside gas comprises a mixture of trimethylvinylsilane and hexafluoroacetylacetic acid.

6. The method of claim 1 wherein the backside gas comprises a mixture of trimethylvinylsilane and hexafluoroacetylacetic acid and the concentration of trimethylvinylsilane is higher than the concentration of hexafluoroacetylacetic acid.

7. The method of claim 1 wherein the backside gas comprises a mixture of approximately 50% trimethylvinylsilane and approximately 20% to 40% hexafluoroacetylacetic acid.

8. The method of claim 1 wherein the shield does not come into contact with the wafer.

* * * * *